(12) United States Patent
Von Koblinski et al.

(10) Patent No.: US 8,841,768 B2
(45) Date of Patent: Sep. 23, 2014

(54) CHIP PACKAGE AND A METHOD FOR MANUFACTURING A CHIP PACKAGE

(75) Inventors: Carsten Von Koblinski, Bodensdorf (AT); Michael Knabl, Sattendorf (AT); Ursula Meyer, Villach-Landskron (AT); Francisco Javier Santos Rodriguez, Villach (AT); Alexander Breymesser, Villach (AT); Andre Brockmeier, Villach (AT)

(73) Assignee: Infineon Technologies AG, Neubiberg (DE)

( * ) Notice: Subject to any disclaimer, the term of this patent is extended or adjusted under 35 U.S.C. 154(b) by 242 days.

(21) Appl. No.: 13/555,248

(22) Filed: Jul. 23, 2012

(65) Prior Publication Data

US 2014/0021610 A1    Jan. 23, 2014

(51) Int. Cl.
*H01L 23/48*    (2006.01)
(52) U.S. Cl.
USPC ............ 257/741; 257/E23.051; 257/E31.131; 257/E23.08; 257/E23.088; 257/E23.087; 257/E23.102; 257/E23.104; 438/122
(58) Field of Classification Search
USPC ............ 257/741, E23.051, E31.131, E23.08, 257/E23.088, E23.087, E23.102, E23.104; 438/122
See application file for complete search history.

(56) References Cited

U.S. PATENT DOCUMENTS

| 5,958,100 A | 9/1999 | Farnworth et al. |
| 7,652,305 B2 | 1/2010 | Chatterjee et al. |
| 2004/0206953 A1 | 10/2004 | Morena et al. |

FOREIGN PATENT DOCUMENTS

| DE | 69428578 T2 | 10/2001 |
| DE | 10104219 B4 | 5/2006 |
| DE | 10053307 B4 | 6/2008 |
| EP | 0658933 B1 | 10/2001 |

OTHER PUBLICATIONS

English language abstract of DE 10053307 B4, May 2002.
English language abstract of DE 10104219 B4, Aug. 2002.

*Primary Examiner* — Thao X Le
*Assistant Examiner* — Matthew Gordon

(57) ABSTRACT

A chip package is provided, the chip package including: first encapsulation structure; first passivation layer formed over first encapsulation structure and first electrically conductive layer formed over first passivation layer; at least one chip arranged over first electrically conductive layer and passivation layer wherein at least one chip contact pad contacts first electrically conductive layer; at least one cavity formed in first encapsulation structure, wherein at least one cavity exposes a portion of first passivation layer covering at least one chip contact pad; second encapsulation structure disposed over first encapsulation structure and covering at least one cavity, wherein a chamber region over at least one chip contact pad is defined by at least one cavity and second encapsulation structure; wherein second encapsulation structure includes an inlet and outlet connected to chamber region, wherein inlet and outlet control an inflow and outflow of heat dissipating material to and from chamber region.

26 Claims, 13 Drawing Sheets

110 — forming a first passivation layer over a first encapsulation structure and forming a first electrically conductive layer over the first passivation layer;

120 — arranging at least one chip over the first electrically conductive layer and the first passivation layer wherein at least one chip contact pad contacts the first electrically conductive layer;

130 — forming at least one cavity in the first encapsulation structure, thereby exposing a portion of the first passivation layer covering the at least one chip contact pad;

140 — disposing a second encapsulation structure over the first encapsulation structure and the second encapsulation structure covering the at least one cavity, thereby defining a chamber region over the at least one chip contact pad by the at least one cavity and the second encapsulation structure;

150 — connecting an inlet and outlet of the second encapsulation structure to the chamber region, the inlet and the outlet thereby controlling an inflow and outflow of heat dissipating material to and from the chamber region.

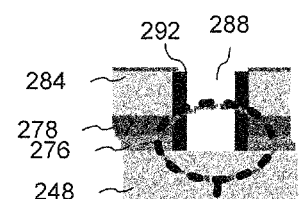
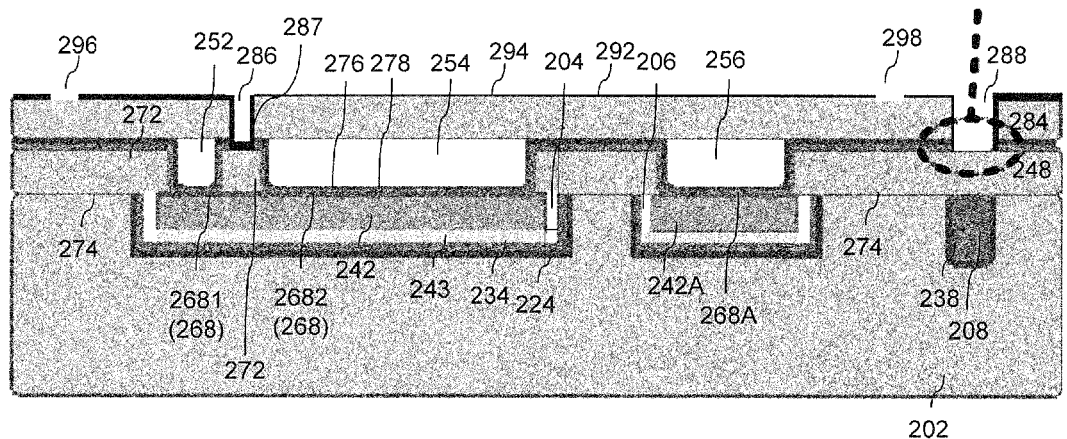
FIG 2S
FIG 2R

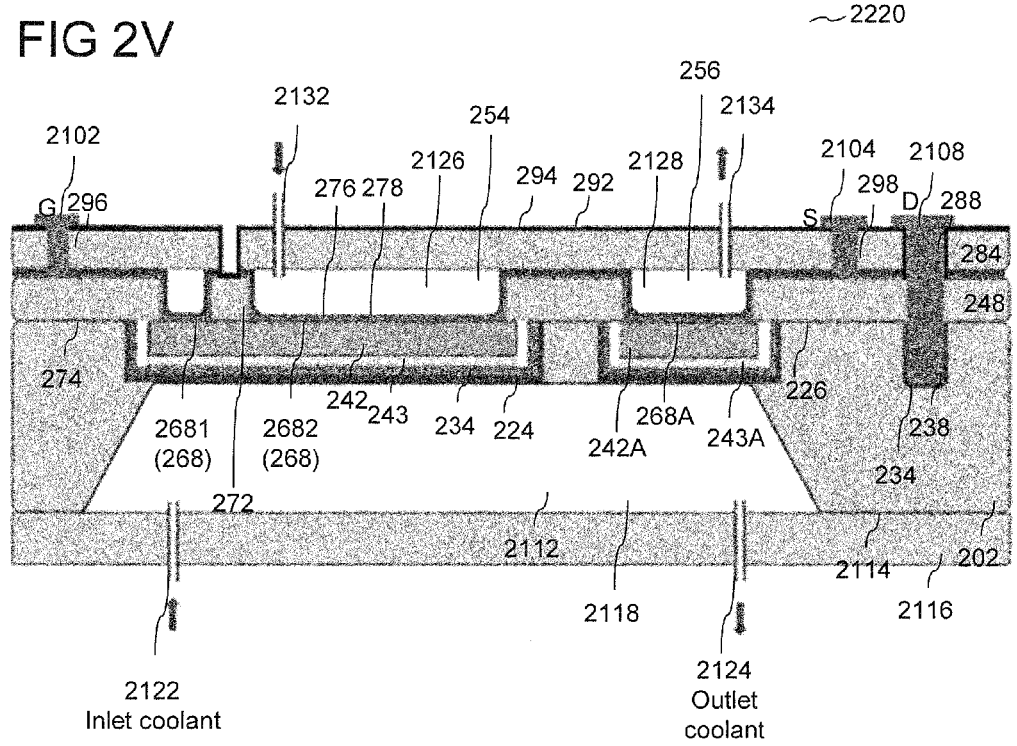

CHIP PACKAGE AND A METHOD FOR MANUFACTURING A CHIP PACKAGE

TECHNICAL FIELD

Various embodiments relate generally to a chip package and a method for manufacturing a chip package.

BACKGROUND

Depending on the applications, high standards may be placed on chip packages for electronic components and electronic elements. Such requirements may include the need for the chip package to exhibit stability, protection against radiation and isolation capabilities. The capability of today's semiconductor chips are limited by efficiency of heat dissipation across the chip package and from the chip package during operation. This may be a result of increasing circuit integrations density and circuit performance, and increasing area-related density, e.g. packing per area. As a result higher thermal loads may be placed on the circuit components. Junction temperatures in current chips may normally be limited to about 150° C. to 200° C. to ensure reliability of the chip package. Current and/or switching frequency may have to be limited, e.g. reduced, to ensure that these temperatures may not be exceeded.

Semiconductor elements or integrated circuits may normally be arranged in enclosed chip housings, to protect them from the external environment during operations. Today's concepts are primarily based on hybrid package construction, through which, the realization of at least two interfaces may be necessary. The first interface, referred to as a chip housing interface, may traditionally be produced by chip manufacturers, wherein complex connection techniques, e.g. wire or flip chip bonding may be used. The second interface may include an interface between the chip housing and the board/module, and may normally be realized by the end-user.

Non-hermetic packages, from plastic or ceramic-based, may meanwhile, be unsuitable for many applications in semiconductor technology, as they may not be sufficient for protecting the electronic chip against external environmental influences, e.g. humidity, radiation, heat. Particularly, due to intensive humidity absorption, these packages may encounter challenges, for example, with respect to reflow solder, or cracking or fracturing through the popcorn-effect, therefore affecting its long term stability.

In order to protect the components from malfunctions or destruction caused by overheating, more measures for cooling of the components may be carried out by the user. Passive and even active methods may be used, which may be extremely challenging, with respect to expenditure, cost and efficiency. In order to reduce cost and expenditure, variable process techniques from the chip manufacturers may be provided, which may minimize thermal load of the components. Conventional methods provide a reduction in the thermal mass of silicon chips, by which, the thickness of the chips, may be reduced, for example by thinning methods, such as grinding or etching. Additionally, effective heat sinks may be integrated on chip level, e.g. using thick metallization. These methods introduce further challenges. The effective thinning of the semiconductor components during preparation may require specially techniques and sophisticated preparation methods. Thick metal layers may lead to a significant mechanical and thermal stress, and to destruction of the components due to the different thermal expansion coefficient between the chip, e.g. silicon, and the metal layers, e.g. Cu, at high temperatures which may be reached during pre-assembly and/or during operation of the chip. Therefore, in most cases, the power semiconductors may only be operated in areas, wherein the heat may not accumulate, to avoid thermal destruction of the chips. The efficiency may therefore be significantly reduced.

Passive cooling solutions, e.g. through use of lead frames, pose a large challenge. Due to the increasing integration density of components, and decreasing pitch distance, the preparation techniques costs and the requirements of solder paste and screen printing are greatly increased. An active cooling may normally, only be realized in the form of an externally attached or glued cooling body, e.g. holding cooling fluids, which may result in a largely reduced efficiency due to the successive insulation interfaces between cooling body and chip housing and between the chip housing and chip. The cost for an efficient chip package may account for more than 90% of the total manufacturing costs, due to the additional integration of appropriate isolations and cooling components.

SUMMARY

Various embodiments provide a chip package, including: a first encapsulation structure; a first passivation layer formed over the first encapsulation structure and a first electrically conductive layer formed over the first passivation layer; at least one chip arranged over the first electrically conductive layer and the first passivation layer wherein at least one chip contact pad contacts the first electrically conductive layer; at least one cavity formed in the first encapsulation structure, wherein the at least one cavity exposes a portion of the first passivation layer covering the at least one chip contact pad; a second encapsulation structure disposed over the first encapsulation structure and covering the at least one cavity, wherein a chamber region over the at least one chip contact pad is defined by the at least one cavity and the second encapsulation structure; wherein the second encapsulation structure includes an inlet and outlet connected to the chamber region, wherein the inlet and the outlet control an inflow and outflow of heat dissipating material to and from the chamber region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method for manufacturing a chip package according to an embodiment;

DETAILED DESCRIPTION

Figure 2A:
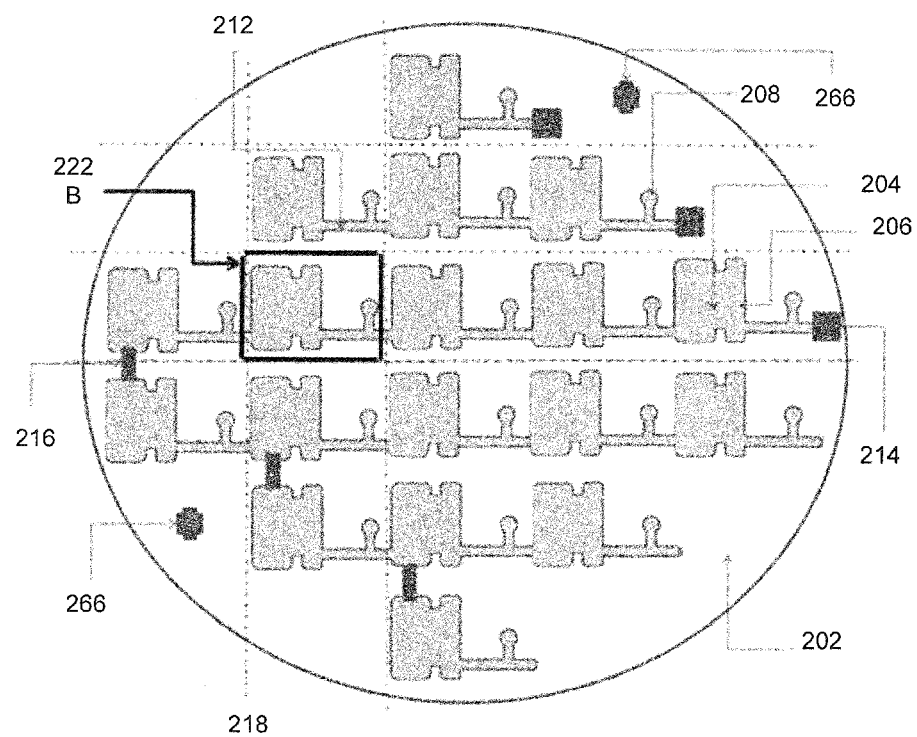
FIGS. 2A to 2V show a method for manufacturing a chip package according to an embodiment.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Chip package design and technology are increasingly important due to the continuous interaction between packages and semiconductor elements, which determines the overall efficiency of the system. Typical customer requirements on the packages, e.g. size, weight, cost, reliability and power efficiency with good heat dissipation at high frequencies and data rates, are associated with higher cost and expenditure. Conventional package concepts are reaching their limits, and therefore, more efficient packages for certain applications may be needed. Newer methods and materials may be needed.

Various embodiment provide a chip package which may use front end chip technologies and back end housing technologies, and forward integration, wherein similarly to microsystems technology, many components as possible may be monolithically integrated. Various embodiments may provide a chip package according to various package concepts, e.g. thin small leadless package (TSLP), wafer level package (WLP), System in package (SiP). The entire technology may be integrated in a housing, so that the board e.g. module assembly may be extremely simplified, to the requirements of the end customer.

Various embodiments provide a method for manufacturing a chip package for semiconductor components at wafer level, using processes and materials which may normally be exclusively used in the area of microsystems techniques, such as MEMS. The materials for manufacturing may be similar to those used microsystems techniques, and may be combined with each other, so that the package may be suitable for applications with low energy expenditure, e.g. batteries, e.g. mobile products, as well as for high power and frequency circuits.

Various embodiments provide a chip package, wherein a housing material may be based on glass, and may offer more choice and better performance compared to traditional material classes of ceramics and polymers. Glass as housing material may be used, because glass, depending on the product group, may offer improved performance over silicon. Silicon may be suitable for micromechanical processing, e.g. due to anisotropic etching of silicon. However, glass, and also ceramics, such as $Al_2O_3$, which may traditionally be used as an isolation base plates for Direct copper bonding (DCB), may offer higher dielectric strength for product groups in high power and RF areas, FIG. 1 shows method 100 for manufacturing a chip package according to an embodiment. Method 100 may include:

forming a first passivation layer over a first encapsulation structure and forming a first electrically conductive layer over the first passivation layer (in 110); arranging at least one chip over the first electrically conductive layer and the first passivation layer wherein at least one chip contact pad contacts the first electrically conductive layer (in 120);

forming at least one cavity in the first encapsulation structure, thereby exposing a portion of the first passivation layer covering the at least one chip contact pad (in 130);

disposing a second encapsulation structure over the first encapsulation structure and the second encapsulation structure covering the at least one cavity, thereby defining a chamber region over the at least one chip contact pad by the at least one cavity and the second encapsulation structure (in 140);

connecting an inlet and outlet of the second encapsulation structure to the chamber region, the inlet and the outlet thereby controlling an inflow and outflow of heat dissipating material to and from the chamber region (in 150).

Figure 3:
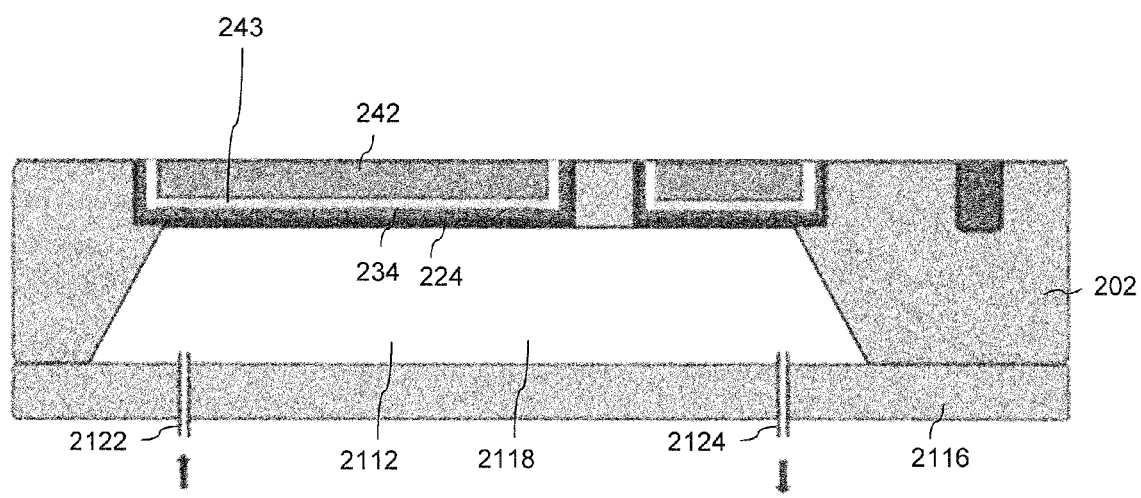
FIG. 3 shows a chip package according to an embodiment.

FIG. 3 shows chip package 310 according to an embodiment. Chip package 310 may include: first encapsulation structure 202; first passivation layer 224 formed over first encapsulation structure 202 and first electrically conductive layer 234 formed over first passivation layer 224; at least one chip 242 arranged over first electrically conductive 234 layer and first passivation layer 224 wherein at least one chip contact pad 243 contacts first electrically conductive layer 234; at least one cavity 2112 formed in first encapsulation structure 202, wherein at least one cavity 2112 exposes a portion of first passivation layer 224 covering at least one chip contact pad 243; second encapsulation structure 2116 disposed over first encapsulation structure 202 and covering at least one cavity 2112, wherein chamber region 2118 over at least one chip contact pad 243 is defined by at least one cavity 2112 and second encapsulation structure 2116; wherein second encapsulation structure 2116 includes inlet 2122 and outlet 2124 connected to chamber region 2118, wherein inlet 2122 and outlet 2124 control an inflow and outflow of heat dissipating material to and from chamber region 2118.

FIGS. 2A to 2V show method 200 for manufacturing a chip package according to various embodiments.

Figure 2B:
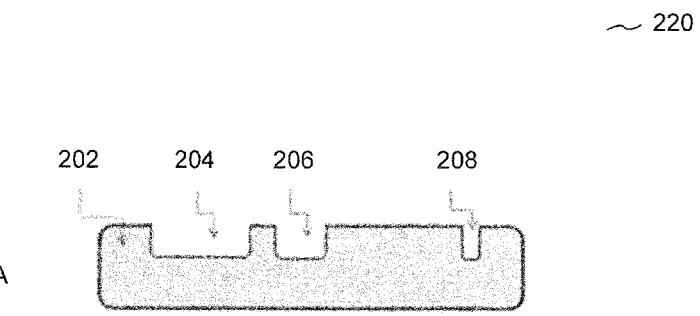
Figure 2C:
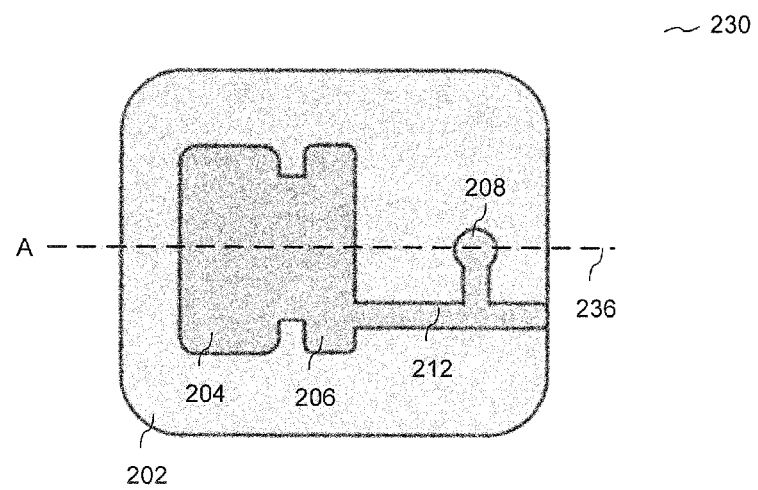

Method 200 may include and/or may begin with structuring first encapsulation structure 202 as shown in FIGS. 2A to 2C.

First encapsulation structure 202 may include a substrate, e.g. wafer, e.g. a panel. The substrate may include a large area panel, e.g. which may be round or rectangular or square. First encapsulation structure 202 may range from about 100 mm×100 mm to about 400 mm×400 mm. However, its dimensions may not be limited to a particular size, and may be dependent on processing machinery and processing constraints. First encapsulation structure 202 may be large enough to ensure that large-scale manufacturing of first encapsulation structure 202 may be possible, and that first encapsulation structure 202 may be a carrier and/or a support for batch processing of a plurality of chips.

First encapsulation structure 202 may include an electrically insulating structure. First encapsulation structure 202 may include glass. For example, first encapsulation structure 202 may include a glass substrate. First encapsulation structure 202 may include at least one material from the following group of materials, the group of materials consisting of: plastic, silicon, ceramics. First encapsulation structure 202 may include a material which substantially matches the coefficient of thermal expansion (CTE) of a chip. For example, first encapsulation structure 202 may include glass whose CTE may match the CTE of a silicon chip. For example, borofloat glass, e.g. schott borofloat 33, whose CTE may match the CTE of silicon, or alternatively float glass.

First encapsulation structure 202 may be structured as a carrier for a plurality of chips. First encapsulation structure 202 may be structured using a photoresist or photolithographically structured hard mask, and etching, e.g. using hydrofluoric acid wet chemical etch. Photo structurable glass, with different etch rates of exposed areas or structuring by glass molding may also be possible.

Cavities and/or recesses 204, 206 may be structured, e.g. formed in, first encapsulation structure 202. These cavities and/or recesses 204, 206 may carry and/or hold one or more chips (not shown). Furthermore, additional cavities 208 for connection points may be formed in first encapsulation structure 202. These additional cavities 208 may be pointed, round or square and may be subsequently filled with electrically conductive material or metal as an interconnect. Recess channel 212 formed in first encapsulation structure 202 may serve as a connection channel connecting the individual cavities 204, 206, 208 to each other. Recess channel 212 may be connected to recesses 204, 206 and additional cavities 208. Electrically conductive material may in subsequent processes be deposited in recess channel 212, e.g. using metal deposition.

Other further cavities 214, 216 may be structured in first encapsulation structure 202, and may subsequently provide electrical connections to other contacts. For example, through use of galvanically deposited contacts at least partially formed in further cavities 214, 216, e.g. interconnected strings of cavities may be formed, and furthermore, uniform distribution of power may be achieved due to the cavities being connected with each other.

Dicing lines 218 are shown as dotted lines 218, demarcate individual chip packages to be individualized from encapsulation structure 202. Each individualized chip package area may be shown as a single area B defined by outlined portion 222.

FIGS. 2B to 2X show method 200 being applied only to single area B. However, it may be understood that method 200 may be applied in a batch process simultaneously to the entire substrate panel 202, which may include a plurality of areas B.

FIG. 2B shows a cross-sectional view of area B. FIG. 2C shows a top-view of area B.

Recesses 204, 206, 208 may be formed in first encapsulation structure 202. Recess channel 212 is shown to connect recess 208 to recess 206 and 204.

Figure 2D:
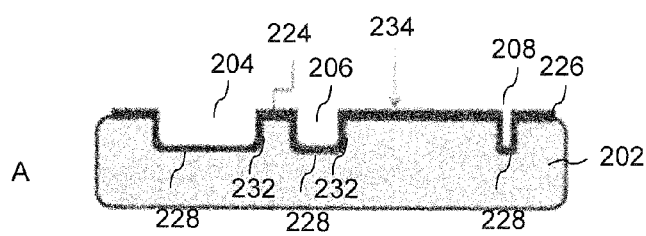
Figure 2E:
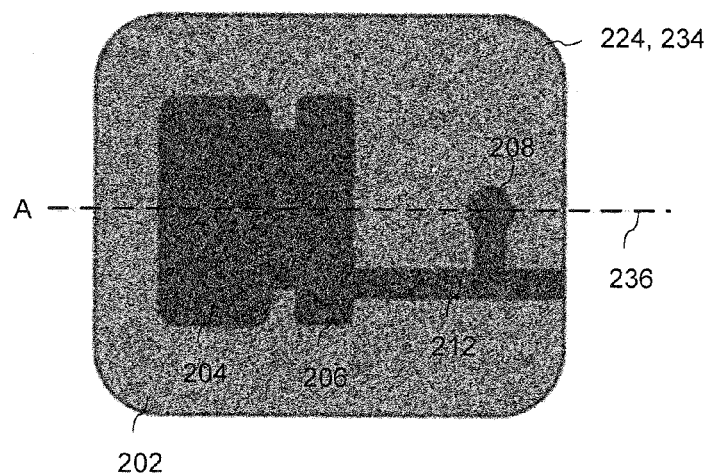

As shown in FIGS. 2D and 2A, first encapsulation structure 202 may include at least one recess 204, 206, 208, wherein at least one first passivation layer 224 and at least one first electrically conductive layer 234 may be formed in at least one recess 204, 206, 208.

First passivation layer 224 may be formed over first encapsulation structure 202. First passivation layer 224 may further be formed in recesses 204, 206, 208, e.g. first passivation layer 224 may line the walls of recesses 204, 206, 208, and the top surfaces 226 of first encapsulation structure 202. First passivation layer 224 may line bottom walls 228 and sidewalls 232 of recesses 204, 206, 208, and recess channel 212.

First electrically conductive layer 234 may be formed over first passivation layer 224. First electrically conductive layer 234 may cover or may line bottom walls 228 and sidewalls 232 of recesses 204, 206, 208, and recess channel 212. As cross-sectional views of FIGS. 2B and 2D may be taken through dotted line A 236, recess channel 212 may not be visible in FIGS. 2B and 2D.

It may be understood that first passivation layer 224 and first electrically conductive layer 234 may merely line the walls of the recesses 204, 206, 208 and may not actually fill recesses 204, 206, 208, therefore even after the formation of first passivation layer 224 and first electrically conductive layer 234, recesses 204, 206, 208 may still be present in first encapsulation structure 202.

First passivation layer 224 may include at least one material from the following group of materials, the group of materials consisting of: polysilicon, silicon dioxide, silicon nitride, aluminum oxide, diamond like carbon, boron nitride, silicon carbide, silicon oxycarbide or generally oxides and nitrides. First passivation layer 224 may function in later processing as an etch stop. First passivation layer 224 may be deposited by chemical vapor deposition or other suitable processes. First passivation layer 224 may have a thickness ranging from about 5 nm to about 1000 nm, e.g. about 75 nm to about 100 nm, e.g. about 100 nm to about 150 nm. First passivation layer 224 may be formed such that it may cover substantially the entire or parts of the surface 226 of the substrate/panel of first encapsulation structure 202, including recesses 204, 206, 208.

First electrically conductive layer 234 may include a metal. First electrically conductive layer 234 may include at least one material, element or alloy from the following group of materials, the group consisting of: copper, aluminum, silver, tin, tungsten, gold, palladium, zinc, nickel, iron, molybdenum, platinum, ruthenium, rhodium, titanium, chromium. First electrically conductive layer 234 may further function as a seed layer for subsequent deposition processes if required. First electrically conductive layer 234 may be deposited by physical vapor deposition or other suitable processes, e.g. sputtering, e.g. evaporation, e.g. chemical or plasma deposition. First electrically conductive layer 234 may be formed such that it may cover substantially first passivation layer 224, which may be formed substantially over the entire surface 226 of the substrate/panel of first encapsulation structure 202, including recesses 204, 206, 208 and 212. First electrically conductive layer 234 may have a thickness ranging from about 5 nm to about 1000 nm, e.g. about 75 nm to about 100 nm, e.g. about 100 nm to about 150 nm.

First passivation layer 224 and first electrically conductive layer 234 may be selected such that first passivation layer 224 and first encapsulation structure 202 may be well adhered to each other. Adhesion between first passivation layer 224 and first encapsulation structure 202 and adhesion between first passivation layer 224 and first electrically conductive layer 234 may play a major role in the reliability of the chip package, and should be matched. For example, glass, e.g. borofloat-glass e.g. float glass, if used in first encapsulation structure 202 may be paired with polysilicon as first passivation layer 224 to ensure reliable adhesion.

Figure 2F:
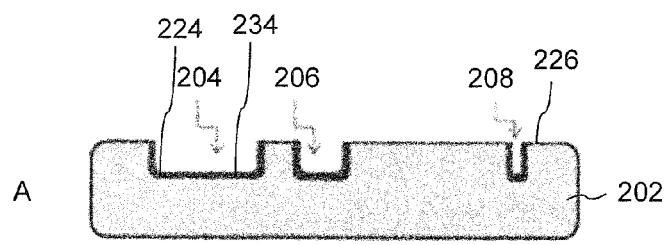
Figure 2G:
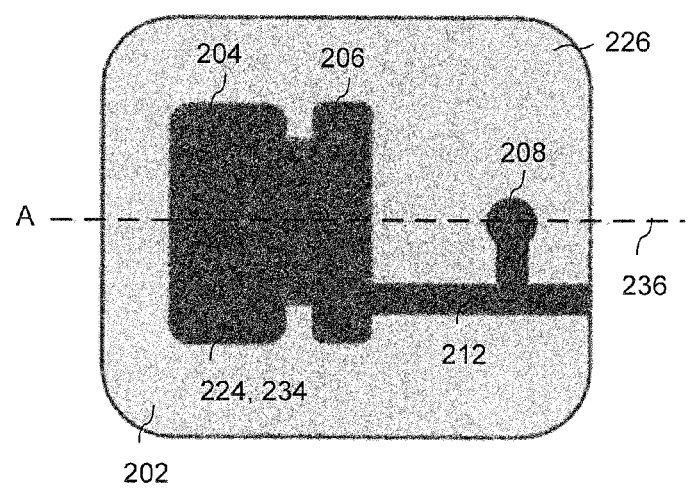

As shown in FIGS. 2F (cross-sectional view) and 2G (top view), portions of first passivation layer 224 and first electrically conductive layer 234 may be removed. Particularly, portions of first passivation layer 224 and first electrically conductive layer 234 formed over top surfaces 226 of first encapsulation structure 202 may be removed from surfaces 226 of the substrate e.g. the glass substrate. Portions of first passivation layer 224 and first electrically conductive layer 234 may remain in recesses 204, 206, 208 and 212 over first encapsulation structure 202. Furthermore, portions of first electrically conductive layer 234 in recesses 204, 206, 208 and 212 may be electrically connected to each other (as shown in FIG. 2I). Various methods may be used for the selective removal of portions of first passivation layer 224 and first electrically conductive layer 234. For example grinding and/or chemical mechanical polishing and/or etching, e.g. wet etching, may be used. Masking, e.g. photo-masking, may be carried out to protect portions of first passivation layer 224 and first electrically conductive layer 234 formed in recesses 204, 206, 208 and 212, from being removed. As a result, portions of first passivation layer 224 and first electrically conductive layer 234 which were masked may remain in recesses 204, 206, 208 and 212. Deep, metallized areas, e.g. first passivation layer 224 and first electrically conductive layer 234, may be formed in recesses 204, 206, 208 and 212, and may further be electrically contacted with the contact opening recesses 214 (not shown).

Figure 2H:
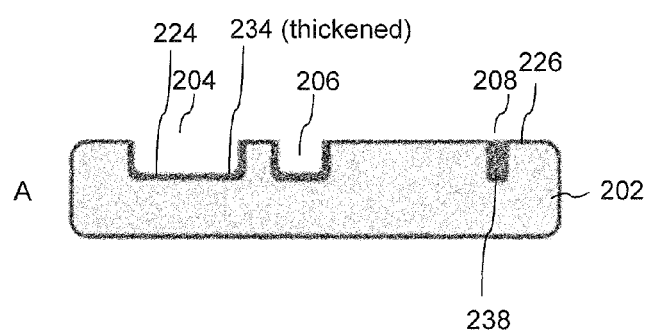
Figure 2I:
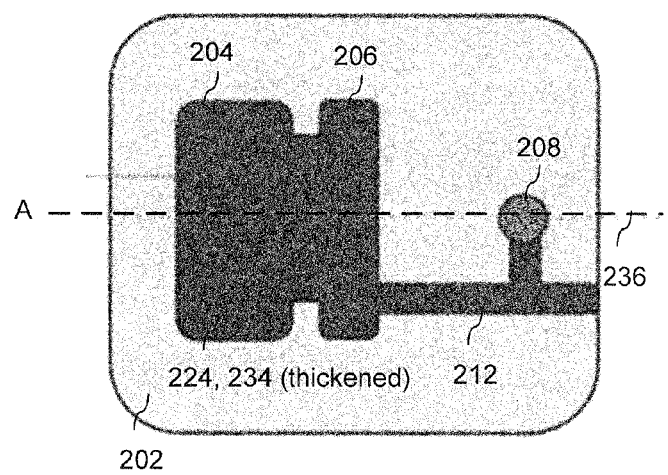

In FIG. 2H (cross-sectional view) and FIG. 2I (top view), first electrically conductive layer 234, i.e. the seed layer metallization, may be thickened. This may be carried out, e.g. by a galvanic process, chemical or plasma deposition in recesses 204, 206. First electrically conductive layer 234 may include copper, other metals or metal alloys, and may be thickened to a thickness ranging from about 5 µm to about 50 µm, e.g. about 10 µm to about 40 µm e.g. about 20 µm to about 30 µm.

Furthermore, low-melting filler 238, may at least partially fill cavity 208, for example local metal deposition. Filler 238 may include solder balls and/or metal plugs and may include a solder material, e.g. one or more alloys of tin and/or lead and/or zinc, e.g. one or more alloys of gold, silver, copper, indium, e.g. Au, e.g. Ag, e.g. Cu, e.g. In, e.g. $Sn_{3.0}Ag_{0.5}Cu$, e.g. other metal alloys.

Figure 2J:
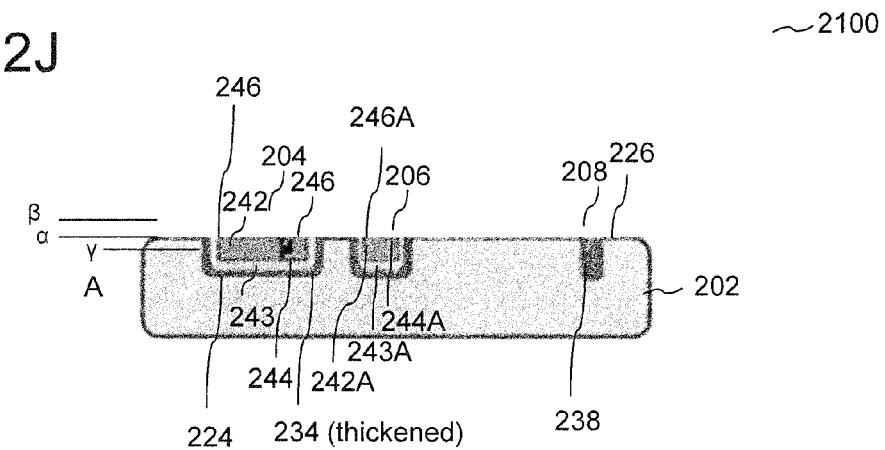
Figure 2K:
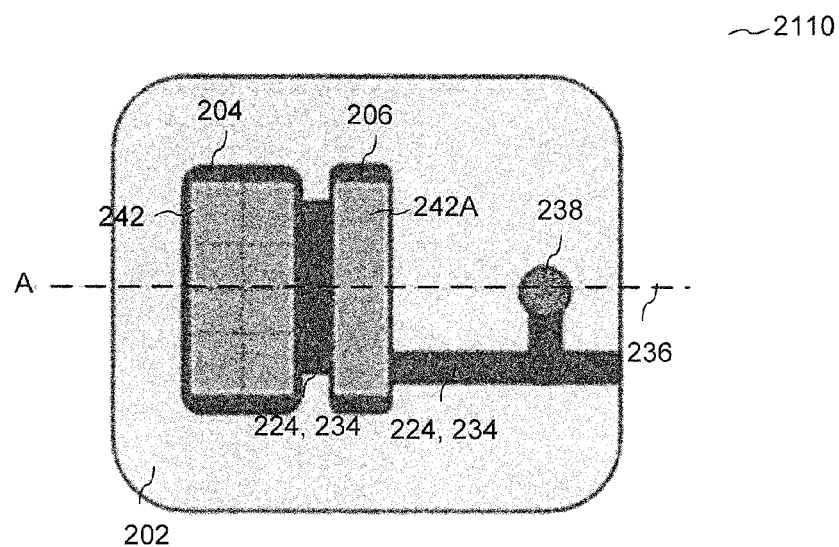

As shown in FIG. 2J (cross-sectional view) and 2K (top view), at least one chip 242, 242A may be formed at least partially in at least one recess 204, 206. For example, chip 242 may be formed in recess 204 and chip 242A may be formed in recess 206. Each chip 242, 242A may include at least one chip contact pad 243, 243A, which may be referred to as chip back side metallization. For example, chip 242 may include at least one chip contact pad 243 formed on chip back side 244, and chip 242A may include at least one chip contact pad 243A formed on chip back side 244A. At least one chip contact pad 243, 243A, or both chip contact pads 243, 243A may contact first electrically conductive layer 234 in at least one recess 204, 206. In other words, chip contact pads 243, 243A may be electrically connected with first electrically conductive layer 234.

At least one chip 242, 242A which may be arranged as part of an electrical circuit may be mounted in the recesses 204, 206, which may be lined with first passivation layer 224 and first electrically conductive layer 234. Adhesion between chip back sides 244, 244A to first electrically conductive layer 234 may be formed by solder and/or glue, e.g. electrically conductive glue, and/or thermal compression, and/or diffusion soldering. At least one chip 242, 242A may include a semiconductor chip, wherein the semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device. For example, at least one chip 242 may include a power insulated gate bipolar transistor (IGBT) and chip 242A may include a freewheeling diode.

According to various other embodiments, it may be understood that at least one chip, e.g. at least one of chips 242, 242A may even include a semiconductor logic chip, wherein the semiconductor logic chip may include at least one semiconductor logic device from the group consisting of: an application specific integrated chip ASIC, a driver, a controller, a sensor. If back side insulation may be required then some electrically insulating adhesive may be deposited between chip back sides, e.g. at least one of chip back sides 244, 244A and first electrically conductive layer 234 instead of soldering.

Chips 242, 242A may have a thickness ranging from about 20 µm to about 600 µm, e.g. about 100 µm to about 500 µm, e.g. about 200 µm to about 400 µm. Recess depth may range from about 20 µm to about 600 µm, e.g. about 100 µm to about 500 µm, e.g. about 200 µm to about 400 µm. It may be understood that recesses 204, 206 may be constructed such that their depth and the metallization thickness, e.g. thickness of first passivation layer 224 and/or first electrically conductive layer 234 may suit the thickness of the chips 242, 242A. For example, the top sides, e.g. upper surface 246, 246A of chips 242, 242A may be higher (indicated by β), lower (indicated by γ) or at substantially same level (indicated by α) with top surface 226 of first encapsulation structure 202. The dimensions of the construction may be similar and/or dissimilar to the dimensions of the die.

Figure 2L:
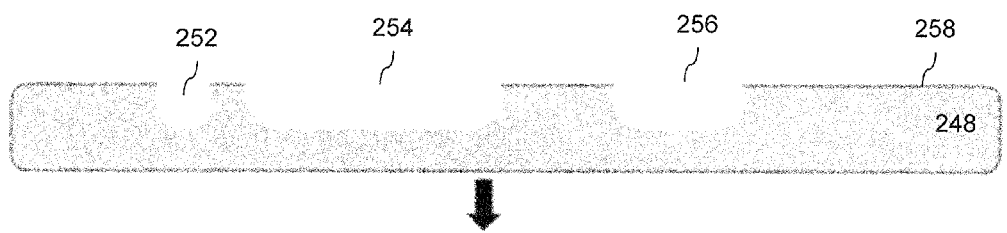

FIG. 2L shows the manufacture of third encapsulation structure 248 according to an embodiment. Third encapsulation structure 248 may include an electrically insulating material. Third encapsulation structure 248 may include at least one material from the following group of materials, the group of materials consisting of: glass, plastic, silicon, ceramics. For example, third encapsulation structure 248 may include borofloat glass, similar to that used for first encapsulation structure 202. Third encapsulation structure 248 may be manufactured for the encapsulation and exposure of electrical contacts 268, 268A of chips 242, 242A on chip front sides 246, 246A. Third encapsulation structure 248 may be smaller in dimension, e.g. scaled, in comparison to first encapsulation structure 202. For example, third encapsulation structure 248 may be thinner than first encapsulation structure 202. For example, first encapsulation structure 202 may have a thickness ranging from about 50 µm to about 2000 µm. Third encapsulation structure 248 may have a thickness ranging from about 10 µm to about 2000 µm.

Structuring of third encapsulation structure 248 may determine the separation of the terminals and/or electrical contacts 268, 268A for chips 242, 242A, in particular, components with more than one front side contact.

Figure 2M:
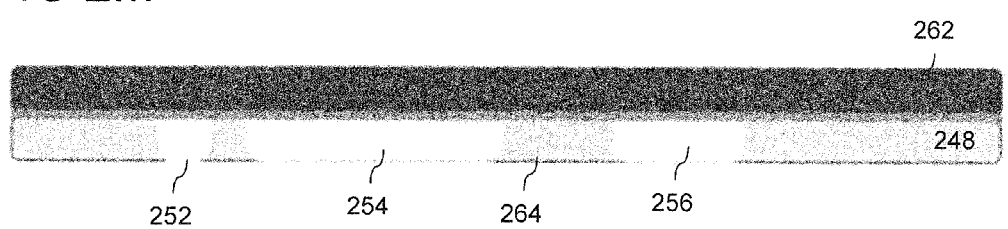
Figure 2N:
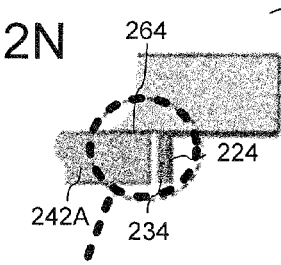

One or more cavities 252, 254, 256 may be formed in third encapsulation structure 248, e.g. in first side 258, e.g. top side 258, of third encapsulation structure 248, e.g. using a wet isotropic etch. The isotropic etch profile from the wet etch structuring of the third encapsulation structure 248 may be ideal for stabilization and even for creating an edge isolation to minimize field effects and/or short circuiting of electrical components. Formation of cavities 252, 254, 256 may be carried out, for example, by etching using hydrofluoric acid as an etchant. Alternatively, plasma etching and/or mechanical structural may be used. Third encapsulation structure 248 may be held on a first side 258 by temporary carrier 262 and/or stabilizer and/or foil as shown in FIG. 2M. Following which, one or more cavities 252, 254, 256 may be polished from back side 264 of third encapsulation structure 248, e.g. with mechanical grinding and/or polishing processes, such that one or more cavities 252, 254, 256 form through-holes 252, 254, 256 through third encapsulation structure 248. As shown in the inset of FIG. 2N, the wet etch structuring may allow for overlay and/or overlap 264 of third encapsulation structure 248 over at least part of chips 242, 242A, which may help to electrically insulate chips 242, 242A, therefore, providing the edge isolation, e.g. the isolation of chip sidewalls, to minimize field effects and/or short circuits. Additionally, filler materials, which may normally be used for embedding of chips may not be necessary, so risk of damage of the electrical connections through filler particles may be eliminated.

Figure 2O:
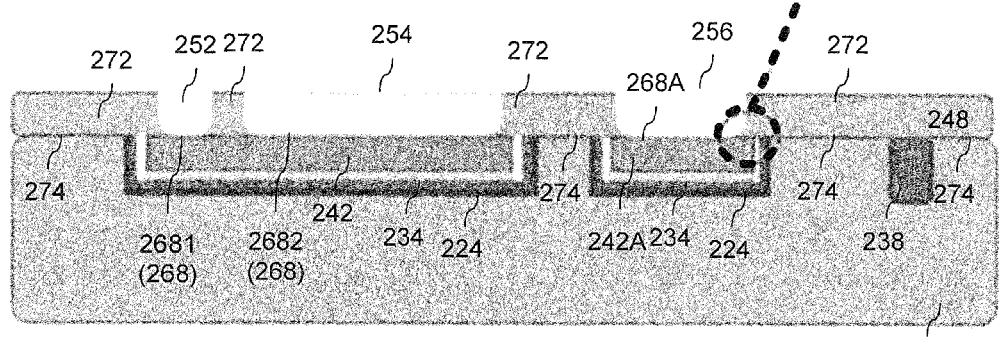

As shown in FIG. 2O, third encapsulation structure 248 may be disposed over first encapsulation structure 202, wherein at least one chip 242, 242A may be held between first encapsulation structure 202 and third encapsulation structure 248. First encapsulation structure 202 may support at least one chip 242, 242A from the chip sidewalls and at least part of at least one chip bottom side 244, 244A. The third encapsulation structure 248 may be disposed over at least one chip top side 246, 246A and may hold at least one chip 242, 242A from at least one chip top side 246, 246A.

Third encapsulation structure 248 may be adhered to first encapsulation structure 202. The connection of third encapsulation structure 248 and first encapsulation structure 202 may be achieved by thermal bonding e.g. direct bonding and/or via an adhesive e.g. epoxy or other organic materials like polyimide, polynorbornene, BCB and/or ceramic adhesives or glass soldering of third encapsulation structure 248 and first encapsulation structure 202 outside the holes 252, 254, 256. Adhesion interfaces 274 may be formed between third encapsulation structure 248 and first encapsulation structure 202.

Third encapsulation structure 248 may be laid over first encapsulation structure 202, wherein their positions may be adjusted through the use of adjustment markers, e.g. alignment marks 266. These alignment marks 266 are shown in first encapsulation structure 202 in FIG. 2A, and may also be arranged on third encapsulation structure 248, e.g. in the edge areas. Third encapsulation structure 248 may be arranged over encapsulation structure 202 which may hold chips 242, 242A, such that through-holes 252, 254, 256 may be arranged over at least one further chip contact pad 268, 268A formed over chip top sides 246, 246A. In other words, such that at least one further chip contact pad 268, 268A may be free from third encapsulation structure 248. In other words, at least one further contact pad 268, 268A may be exposed. At least one further chip contact pad 2681, 2682 (collectively referred to as 268) may be formed over top side 246 of chip 242. At least one further chip contact pad 268A may be formed over top side 246A of chip 242A. Portions 272 of third encapsulation structure 248 formed between and/or separating through-holes 252, 254, 256, may electrically insulate further chip contact pads 268, 268A and 2681, 2682 from each other.

Figure 2P:
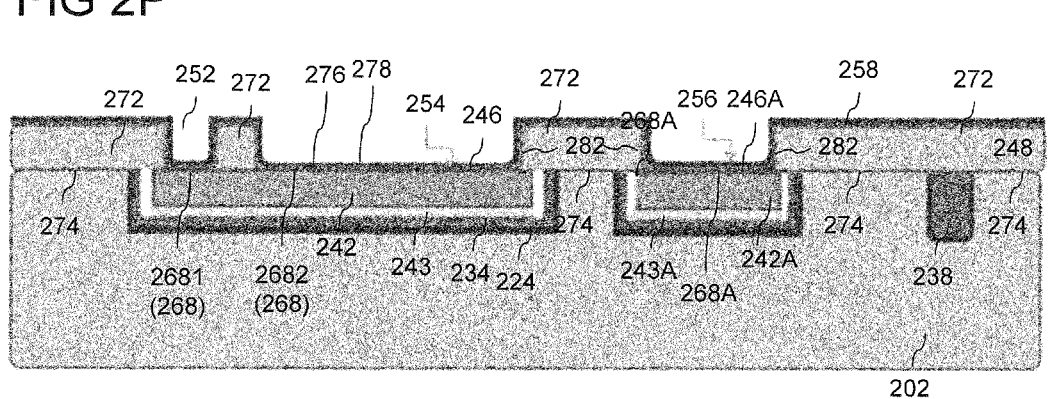

As shown in FIG. 2P, second electrically conductive layer 276 may be formed over third encapsulation structure 248, including portions 272 of third encapsulation structure 248, and further in at least one hole, e.g. holes 252, 254, 256. Second electrically conductive layer 276 may line sidewalls 282 of holes 252, 254, 256 and may be formed over further contact pads 268, 268A. Second electrically conductive layer 276 may cover at least one further contact pad 268 (including 2681, 2682), 268A. Second electrically conductive layer 276 may substantially fully cover surfaces, e.g. top side 258, of third encapsulation structure 248. In order to electrically contact the chip surface, second electrically conductive layer 276 may be deposited using methods similar to deposition of first electrically conductive layer 234. For example, using physical vapor deposition or alternatively using galvanic deposition from a seed layer.

The entire surface 258 of third encapsulation structure 248 may have an electrically conductive, e.g. metal, connection to chips 242, 242A. It may therefore be possible to accommodate more connections on smaller surfaces, and furthermore create a local independence of connection points. Furthermore, the integration of passive elements, e.g. resistors, capacitors, inductors, and connection over the entire metallic surface may be possible. Parasitic elements, e.g. parasitic resistance and/or parasitic capacitances, which may normally be associated with bond connections, e.g. wire bond connections, may be minimized. These may particularly be critical for high-frequency applications, wherein parasitic may influence the overall performance. Furthermore the entire surface connection may be improved with respect to vibrations resistance because micro cracks or fractures of bond connections may occur due to vibrations.

Second passivation layer 278 may be formed over second electrically conductive layer 276 and may thereby also cover at least one further contact pad 268, 268A. Second passivation layer 278 may substantially fully cover second electrically conductive layer 276, therefore, substantially, the entire metallization layer of second electrically conductive layer 276 may be passivated. The deposition of second passivation layer 278 may be conformal to the third encapsulation structure 248, and second passivation layer 278 may have good adhesion to second electrically conductive layer 276. Because of the temperature budget which may be dependent and/or limited by a metallic second electrically conductive layer 276, the deposition of second passivation layer 278 may include a low temperature method for example, plasma enhanced chemical vapor deposition (PECVD). Second passivation layer 278 may function as an isolation bather between the metallization second electrically conductive layer 276 and the coolant.

Figure 2Q:
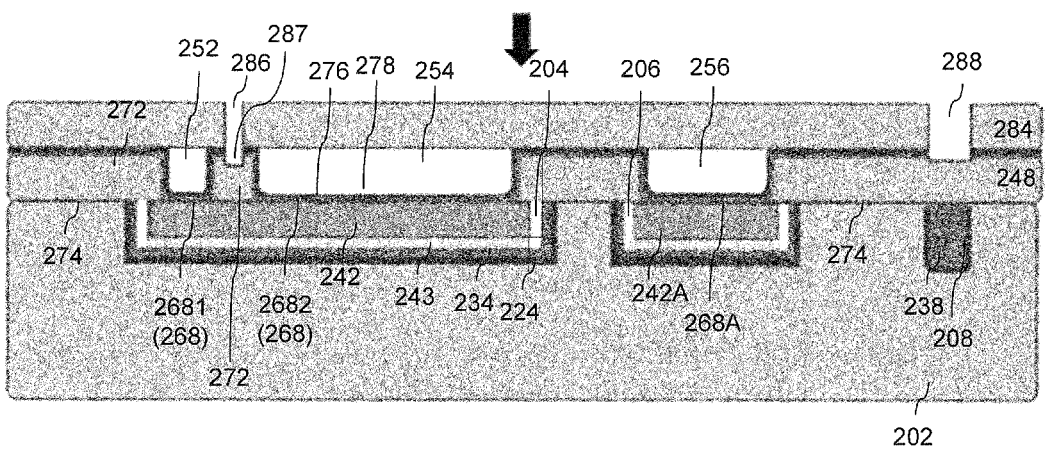

As shown in FIG. 2Q, fourth encapsulation structure 284 may be arranged over third encapsulation structure 248. Fourth encapsulation structure 284 may include glass, plastic, silicon or ceramics. Fourth encapsulation structure 284 may be arranged over third encapsulation structure 248 and/or first encapsulation structure 202 using alignment marks 266 in the edge regions (not shown in fourth encapsulation structure 284), but which may be used to accurately position fourth encapsulation structure 284. Adhesion may be carried out, depending on the materials selected for third encapsulation structure 248 and fourth encapsulation structure 284, e.g. using glue, e.g. epoxy or other organic materials like polyimide, polynorbornene, BCB and/or ceramic adhesives, or glass soldering and/or thermal bonding. Fourth encapsulation structure 284 may be structured. For example, one or more holes 286, 288 may be structured in fourth encapsulation structure 284. Fourth encapsulation structure 284 may have a thickness ranging from about 30 μm to about 2000 μm.

Hole 286 may be structured and/or arranged over portion 272 of third encapsulation structure 248, between chip contact pad 2681 and chip contact pad 2682. Hole 286 may be formed through fourth encapsulation structure 284, and further extending through second passivation layer 278 and second electrically conductive layer 276, and/or further in portion 272 of third encapsulation structure 248. However, it may be noted that only a portion of third encapsulation structure 248 be excavated for hole 286, and third encapsulation structure 248 may not be pierced fully through, e.g. hole 286 may still be separated from chip 242 by third encapsulation structure 248. Hole 286 may create an electrical discontinuity 287 (open circuit) between second electrically conductive layer 276 formed over chip contact pad 2681 and second electrically conductive layer 276 formed over chip contact pad 2682. The separation of a gate region (shown later) from a normal contact region, e.g. source region, may be achieved through sawing or laser method for example laser ablation of hole 286, to create electrical discontinuity 287. Hole 288 may be formed over filler 238 formed in cavity 208. Hole 288 may be formed through second electrically conductive layer 276 and second passivation layer 278. Holes 286, 288 may be formed for example, by milling, boring, laser ablation, until third encapsulation structure 248 is drilled only partially through, however the holes do not fully pierce through the third encapsulation structure 248. Holes 286, 288 may be used subsequently as intermetallic areas for the chip, and may be formed using a suitable method, e.g. etching, e.g. laser ablation. One or more holes 286, 288 may optionally already be pre-structured in fourth encapsulation structure 284, e.g. over filler 238 and recess 208.

As shown in FIG. 2R, third passivation layer 292 may be formed over fourth encapsulation structure 284. Third passivation layer 292 may be formed over top side 294 of fourth encapsulation structure 284 and may line holes 286, 288. Third passivation layer 292 may provide electrical insulation and/or passivation for second electrically conductive layer 276 in holes 286, 288, for example in discontinuity 287. Third passivation layer 292 may include a dielectric material. Third passivation layer 292 may include at least one material from the following group of materials, the group of materials consisting of: polysilicon, silicon dioxide, silicon nitride, aluminum oxide, diamond like carbon. Third passivation layer 292 may substantially cover entire surface 294 of fourth encapsulation structure 284. Due to the already deposited metallization, a low-temperature method, e.g. PECVD may be used for the deposition of third passivation layer 292.

Figure 2T:
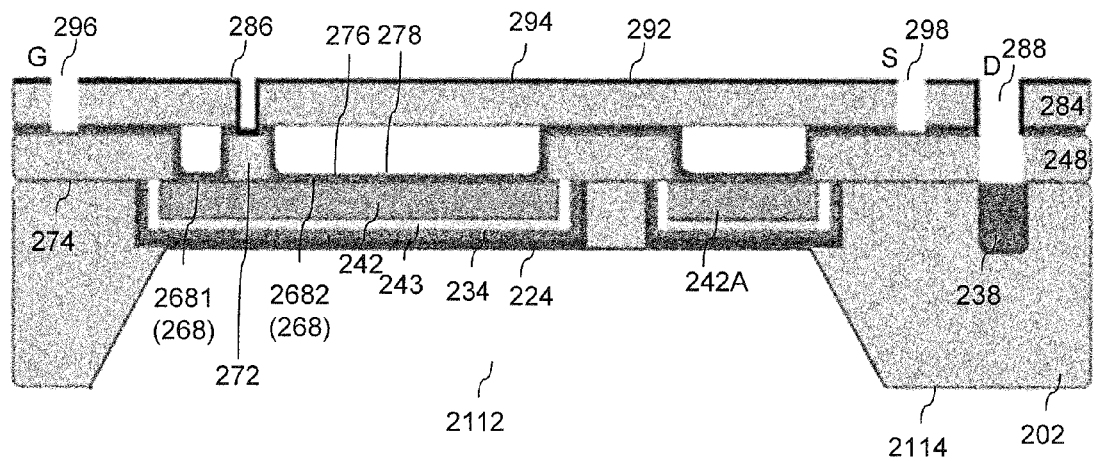
Figure 2U:
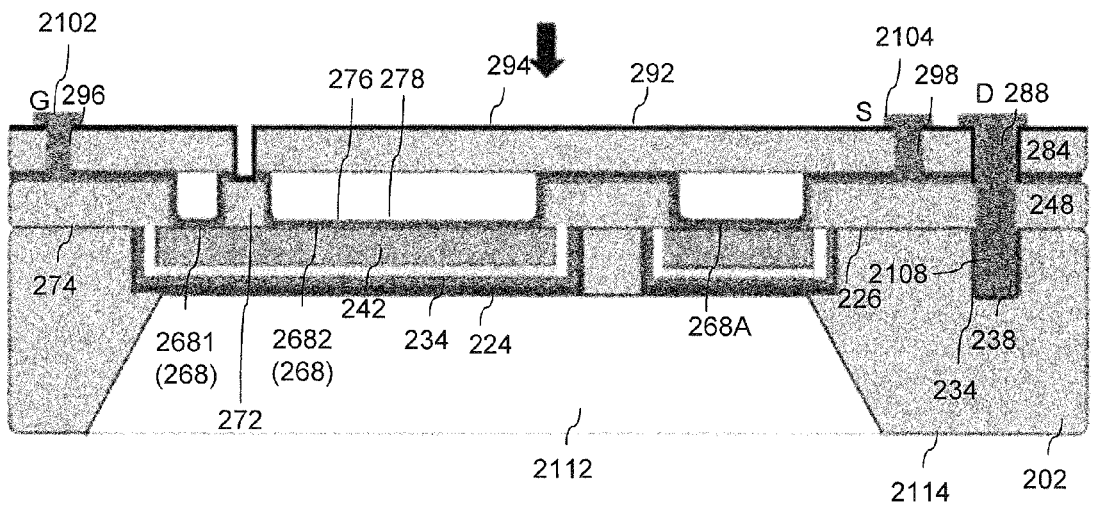

As shown in FIGS. 2R, 2T and 2U, opening of contact areas 296, 298 may be carried out in third passivation layer 292. Opening of contact areas 296, 298 may be carried out photolithography and wet etch and/or mechanical boring for example laser techniques.

At least one through-hole 296, 298 may be formed through third passivation layer 292 (as shown in FIG. 2R), fourth encapsulation structure 284 and second passivation layer 278 (as shown in FIGS. 2T and 2U)), but not through second electrically conductive layer 276. This is so that at least one electrical interconnect 2102, 2104 may be formed in at least one through-hole 296, 298 and may be electrically connected to second electrically conductive layer 276. Electrical interconnect 2102 may form a gate region of the chip package arrangement. Electrical interconnect 2104 may form a source region of the chip package arrangement. Electrical interconnects 2102, 2104 may electrically contact separated portions of second electrically conductive layer 276 (Second electrically conductive layer 276 being separated by discontinuity 287 and third passivation layer 292 over discontinuity 287). For example, electrical interconnect 2102, i.e. gate region, may electrically connect a portion of second electrically conductive layer 276 which may be in electrical contact with chip contact pad 2681, and electrically isolated from chip contact pad 2682. Therefore, second electrically conductive layer 276 may electrically redirect at least one further chip contact pad 2681, to at least one electrical interconnect 2102. For example, electrical interconnect 2104, i.e. source region, may electrically connect a portion of second electrically conductive layer 276 which may be in electrical contact with chip contact pad 2682 and/or chip contact pad 268A, and electrically isolated from chip contact pad 2681. Therefore, second electrically conductive layer 276 may electrically redirect at least one further chip contact pad 2682, to at least one electrical interconnect 2104. In other words, second electrically conductive layer 276 may behave like a redistribution layer which fan-out chip contact pads 268, 268A to electrical interconnects 2102, 2104 situated away from contact pads 268, 268A.

Further through-hole 2106, which may be an extension of hole 288 may be formed in third encapsulation structure 248, therefore through-hole 2106 may be formed through fourth encapsulation structure 284, second passivation layer 278, second electrically conductive layer 276 and third encapsulation structure 248. At least one further electrical interconnect 2108, i.e. drain region, may be formed, e.g. deposited, in at least one further through-hole 2106, wherein at least one further electrical interconnect 2108 may electrically contact first electrically conductive layer 234 via filler 238. It may be understood therefore that at least one further electrical interconnect 2108 may be electrically connected to first electrically conductive layer 234 formed in cavities 204, 206 and recess connection channel 212, and filler 238. It may be understood that passivation layer 292, as shown in the inset of FIG. 2S, may provide electrical insulation and/or isolation between the contact surfaces of chip back sides 244, 244A and chip front sides 246, 246A as at least one further electrical interconnect 2108 may be electrically insulated from second electrically conductive layer 276 by passivation layer 292 formed over sidewalls of hole 288. Chip back sides 244, 244A may be electrically connected to further electrical interconnect 2108, which may include a drain region. Second electrically conductive layer 276 may electrically redirect at least one chip contact pad 243, 243A to at least one electrical interconnect 2104.

Electrical interconnects 2102, 2104, and further electrical interconnect 2108 may be formed, e.g. by at least partially filling holes 296, 298, 288, 2108 with electrically conductive material, e.g. metals, for example using electroless galvanic or plasma deposition. Electrical interconnects 2102, 2104, 2108 may include, e.g. metal plugs. Solder balls may also be attached to electrical interconnects 2102, 2104, 2108.

Electrical interconnects 2102, 2104, 2108, e.g. even all chip connection contacts, may be arranged on the front side 294 of the chip package.

At least one cavity 2112 may be formed in first encapsulation structure 202, e.g. from a back side 2114 of first encapsulation structure 202, i.e. back side of the package. Back side 2114 may face a direction opposite to the direction which top sides 226, 294 face. Forming at least one cavity 2112 in first encapsulation structure 202 may thereby expose a portion of first passivation layer 224 covering at least one chip contact pad 243, 243A.

Cavity 2112 may be formed, e.g. by wet chemical structuring. First passivation layer 224 may function as an etch stop layer. Here, the thermal resistance of glass on the backside in area of the chips may be reduced. As shown in FIG. 2U cavity 2112 may be formed over both chip contact pad 234 and 234A.

As shown in FIG. 2V, second encapsulation structure 2116 may be formed over first encapsulation structure 202, e.g. over back side 2114 of first encapsulation structure 202. Second encapsulation structure 2116 may cover at least one cavity 2112, therefore, chamber region 2118 over at least one chip contact pad 243, 243A may be defined by at least one cavity 2118 and second encapsulation structure 2116.

At least one inlet 2122 and outlet 2124 of second encapsulation structure 2116 may be connected to chamber region 2118. Inlet 2122 and outlet 2124 may each include at least one through hole formed in second encapsulation structure 2116, and may thereby control an inflow and outflow of heat dissipating material to and from the chamber region 2118.

Second encapsulation structure 2116 may be formed over first encapsulation structure 202 and/or joined to first encapsulation structure 202 using similar methods to those used for joining first encapsulation structure 202 and third encapsulation structure 248. Second encapsulation structure 2116 may have a thickness ranging from about 10 μm to about 2000 μm.

It may be understood that according to various embodiments, first encapsulation structure 202, second encapsulation structure 2116, third encapsulation structure 248 and fourth encapsulation structure 284 may include the same material, for example, they may each be formed monolithically from glass, e.g. float glass, e.g. borofloat glass. The encapsulation structures may be also a combination of different materials like glass and/or silicon and/or plastic and/or ceramics.

Fourth encapsulation structure 284 which may be formed over third encapsulation structure 248 may cover at least one hole 254, 256. Fourth encapsulation structure 284 and at least one hole 254, 256 may define further chamber region 2126, 2128 over at least one further chip contact pad 2682, 268A. For example, first further chamber region 2126 may be formed over further chip contact pad 2682, and second further chamber region 2128 may be formed over further chip contact pad 268A.

Fourth encapsulation structure 284 may include at least one of a further inlet 2132 and further outlet 2134 connected to further chamber region 2126, 2128, wherein at least one of a further inlet 2132 and further outlet 2134 control an inflow and outflow of heat dissipating material to and from the further chamber region 2126, 2128.

The heat dissipation material may include a coolant. The heat dissipation material may include at least one material from the following group of materials, the group of materials consisting of: air, water, oil, e.g. fluorine containing liquids like perfluorether or organic liquids.

Inlets 2122, 2132 and outlets 2124, 2134 for the inflow and outflow of coolant may be formed through methods, for example, boring, drilling, milling, laser structuring. Inlets 2122, 2132 and outlets 2124, 2134 may include holes formed in the encapsulation structures. Inlets 2122, 2132 and outlets 2124, 2134 may include metal tubes inserted in the encapsulation structures and connected to chambers 2112, 2126, 2128. Both isolating, e.g. fluorine containing liquids, and non-isolating coolants, e.g. water, may be used. Therefore, first passivation layer 224 and second passivation layer 278, in addition to functioning as etch stop layers, particular for the formation of at least one cavity 2112, may protect the metallization layers, i.e. first electrically conductive layer 234 and second electrically conductive layer 276 respectively, from the heat dissipating material, i.e. the coolant, and therefore prevent the formation of a short-circuit.

Inlets 2122, 2132 may be connected to a source of heat dissipation material. For example, inflow of heat dissipation material via inlet 2122 from the source may allow heat dissipation material to enter the chambers 2112 and inflow of heat dissipation material via inlets 2132 from the source may allow heat dissipation material to enter the chambers 2126 and/or 2128. Heat dissipation material may flow directly over chip contact pads 268, 268A and 243, 243A respectively and may remove heat from chip contact pads 268, 268A, 243, 243A. Heat dissipation material may flow over electrically conductive layers 234, 276, and may be separated from electrically conductive layers 234, 276 only by passivation layers 224, 278. Movement of heat dissipation material over chip contact pads 268, 268A, 243, 243A may transport heat away from chip contact pads 268, 268A, 243, 243A. Movement of heat dissipation material over chip contact pads 268, 268A, 243, 243A may then lead to outflow of heat dissipation material from chambers 2112, 2126, 2128 via outlets 2124, 2134. The source of heat dissipation material may optionally also be connected to a cycling component, e.g. a pump, which may ensure that heat dissipation material leaving the chambers 2112, 2126, 2128 via outlets 2124, 2134 may be recycled by being re-input into the chambers 2112, 2126, 2128 via inlets 2122, 2132. The source of heat dissipation material and/or optional cycling component may be externally connected to the chip package, e.g. to any one of first, second, third or fourth encapsulation structures 202, 2116, 248, 284. Alternatively, the source of heat dissipation material and/or optional cycling component may be provided by the end user, e.g. as part of a larger system which may be connected to inlets 2122, 2132 and/or outlets 2124, 2134.

The singulation of chip packages along dicing lines 218, may subsequently be carried out. A resulting chip package from method 200 may include chip package 2280 (as shown in FIG. 2V) and/or chip package 310 (as shown in FIG. 3).

Various embodiments provide a chip package which may not be built like a traditional hybrid package, which may include chip-isolation housings with multiple interfaces and materials including cooling. Various embodiments provide a chip package which may comprise monolithic structures, and which may comprise front end materials using front end processes. Every component may play a role with regards to stability, cooling efficiency, and radiation and isolations capabilities.

Various embodiments provide a method for manufacturing a chip package at wafer level, and the integration of an active cooling system, e.g. air, water or oil, directly on the chip, e.g. directly over the chip contacts. This may eventually significantly reduce the expenditure by the end consumer, and the chip itself may be implemented by "plug & play", omitting complex board and/or module assemblies.

Various embodiments provide a chip package which may be based on unconventional materials such as e.g. glass, which may provide hermetic sealing of the package, and which may eventually improve the long-term stability and reliability of the electronic semiconductor elements. Furthermore, the temperature for sealing of the package, may be reduced, through the variable material properties, e.g. glass, e.g. low-melting glass. High temperatures and related oxidation of the semiconductor components and metals for electrical connections may be avoided.

Various embodiments provide a chip package, wherein a chip package geometry may kept small, e.g. a chip package with a small fixture, installation height, body thickness and weight. Various embodiments provide a chip package which may be suitable for many product classes and sizes, e.g. power chip technologies and inverter circuits. Various embodiments provide a chip package wherein interfaces associated with hybrid packages, which may contribute to reliability issues may be reduced. For example, interface issues between housing and chip, and/or between chip housing and printed circuit board may be avoided. Various embodiments provide a chip package wherein no complex bond connection techniques may be necessary. For example, wiring or flip-chip bonds and/or board assembly may no longer be necessary, which may result in better performance for high frequency chip packages due to fewer parasitic elements, and therefore overall better quality. Various embodiments provide a chip package wherein expenditure, cost and performance may be optimized through integration of direct cooling on chip. Various embodiments provide a chip package which may provide secure workability for end consumer, e.g. a plug and play chip package. Various embodiments provide a chip package, which may be structured substantially from glass, and which may therefore incur a lower thermal load because the coefficient of thermal expansion of glass and other semiconductor materials, e.g. silicon may be matched. Various embodiments provide a chip package with high thermal, mechanical and chemical stability. Various embodiments provide a chip package with high reliability and long term stability. Various embodiments provide a chip package with little or no volume loss. Various embodiments provide a chip package with good isolation and breakdown strength, with lower and/or no moisture absorption, and avoiding fracture or cracks, e.g. popcorn effect, due to humidity as a result of solder operation. Various embodiments provide a chip package which is environmentally friendly, with virtually no contaminants. Various embodiments provide a chip package which may be manufactured with many different processes, e.g. grinding, e.g. etching, e.g. sawing, e.g. milling, e.g. boring, e.g. drilling, e.g. laser structuring, and wherein unevenness on planar glass surfaces may be removed through mechanical and/or chemical methods. Various embodiments provide a chip package which may be flexibly manufactured according to material requirements through variable assembly and process parameters. Various embodiments provide a chip package which may have higher transparency, therefore allowing easier adjustment to each other.

Various embodiments provide a chip package, including: a first encapsulation structure; a first passivation layer formed over the first encapsulation structure and a first electrically conductive layer formed over the first passivation layer; at least one chip arranged over the first electrically conductive layer and the first passivation layer wherein at least one chip contact pad contacts the first electrically conductive layer; at least one cavity formed in the first encapsulation structure, wherein the at least one cavity exposes a portion of the first passivation layer covering the at least one chip contact pad; a second encapsulation structure disposed over the first encapsulation structure and covering the at least one cavity, wherein a chamber region over the at least one chip contact pad is defined by the at least one cavity and the second encapsulation structure; wherein the second encapsulation structure includes an inlet and outlet connected to the chamber region, wherein the inlet and the outlet control an inflow and outflow of heat dissipating material to and from the chamber region.

According to an embodiment, the first encapsulation structure includes an electrically insulating structure.

According to an embodiment, the first encapsulation structure includes glass.

According to an embodiment, the first encapsulation structure includes at least one material from the following group of materials, the group of materials consisting of: plastic, silicon, ceramics, glass.

According to an embodiment, the first passivation layer includes at least one material from the following group of materials, the group of materials consisting of: polysilicon, silicon dioxide, silicon nitride, aluminum oxide, diamond like carbon, boron nitride, silicon carbide, silicon oxycarbide.

According to an embodiment, the first electrically conductive layer is thermally conductive.

According to an embodiment, the first electrically conductive layer includes at least one at least one material, element or alloy from the following group of materials, the group consisting of: copper, aluminum, silver, tin, tungsten, gold, palladium, zinc, nickel, iron, molybdenum, platinum, ruthenium, rhodium, titanium, chromium.

According to an embodiment, the first encapsulation structure includes at least one recess, wherein the at least one first passivation layer and the at least one first electrically conductive layer are formed in the at least one recess.

According to an embodiment, the at least one chip includes a power semiconductor chip.

According to an embodiment, the at least one chip is formed at least partially in the at least one recess, wherein the at least one chip contact pad contacts the first electrically conductive layer in the at least one recess.

According to an embodiment, the second encapsulation structure includes at least one material from the following group of materials, the group of materials consisting of: glass, plastic, silicon, ceramics.

According to an embodiment, the second encapsulation structure is adhered to the first encapsulation structure.

According to an embodiment, the inlet and the outlet each includes at least one hole formed through the second encapsulation structure.

According to an embodiment, the inlet and the outlet control an inflow and outflow of heat dissipating material to and from the chamber region, wherein the heat dissipation material comprises a fluid.

According to an embodiment, the inlet and the outlet control an inflow and outflow of heat dissipating material to and from the chamber region, wherein the heat dissipation material includes at least one material from the following group of material, the group of materials consisting of: air, water, oil, fluorine containing liquids, organic liquids.

According to an embodiment, the chip package further includes a third encapsulation structure disposed over the first encapsulation structure, wherein the at least one chip is held between the first encapsulation structure and the third encapsulation structure.

According to an embodiment, the third encapsulation structure includes at least one hole formed through the third encapsulation structure, wherein the at least one hole is arranged over at least one further chip contact pad, thereby exposing the at least one further contact pad.

According to an embodiment, the chip package further includes a second electrically conductive layer formed over the third encapsulation structure and the at least one hole, thereby covering the at least one further contact pad; and a second passivation layer formed over the second electrically conductive layer and covering the at least one further contact pad.

According to an embodiment, the chip package further includes a fourth encapsulation structure formed over the third encapsulation structure and covering the at least one hole, the fourth encapsulation structure and the at least one hole defining a further chamber region over the at least one further chip contact pad.

According to an embodiment, the chip package further includes at least one through-hole formed through the fourth encapsulation structure and the second passivation layer; and at least one electrical interconnect formed in the at least one through-hole, wherein the at least one electrical interconnect electrically contacts the second electrically conductive layer According to an embodiment, the second electrically conductive layer electrically redirects the at least one further chip contact pad to the at least one electrical interconnect.

According to an embodiment, the chip package further includes at least one further through-hole formed through the fourth encapsulation structure, the second passivation layer and the third encapsulation structure; and at least one further electrical interconnect formed in the at least one further through-hole, wherein the at least one further electrical interconnect electrically contacts the first electrically conductive layer.

According to an embodiment, the second electrically conductive layer electrically redirects the at least one chip contact pad to the at least one further electrical interconnect.

According to an embodiment, the fourth encapsulation structure includes at least one of a further inlet and further outlet connected to the further chamber region, wherein the at least one of a further inlet and further outlet controls an inflow and outflow of heat dissipating material to and from the further chamber region.

According to an embodiment, the first encapsulation structure supports the at least one chip from the chip sidewalls and at least part of at least one chip bottom side, and wherein the third encapsulation structure is disposed over at least one chip top side.

Various embodiments provide a method for manufacturing a chip package, the method including: forming a first passivation layer over a first encapsulation structure and forming a first electrically conductive layer over the first passivation layer; arranging at least one chip over the first electrically conductive layer and the first passivation layer wherein at least one chip contact pad contacts the first electrically conductive layer; forming at least one cavity in the first encapsulation structure, thereby exposing a portion of the first passivation layer covering the at least one chip contact pad; disposing a second encapsulation structure over the first encapsulation structure and the second encapsulation structure covering the at least one cavity, thereby defining a chamber region over the at least one chip contact pad by the at least one cavity and the second encapsulation structure; connecting an inlet and outlet of the second encapsulation structure to the chamber region, the inlet and the outlet thereby controlling an inflow and outflow of heat dissipating material to and from the chamber region.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip package, comprising:
   a first encapsulation structure;
   a first passivation layer formed over the first encapsulation structure and a first electrically conductive layer formed over the first passivation layer;
   at least one chip arranged over the first electrically conductive layer and the first passivation layer wherein at least one chip contact pad contacts the first electrically conductive layer;
   at least one cavity formed in the first encapsulation structure, wherein the at least one cavity exposes a portion of the first passivation layer covering the at least one chip contact pad;
   a second encapsulation structure disposed over the first encapsulation structure and covering the at least one cavity, wherein a chamber region over the at least one chip contact pad is defined by the at least one cavity and the second encapsulation structure;
   wherein the second encapsulation structure comprises an inlet and outlet connected to the chamber region, wherein the inlet and the outlet control an inflow and outflow of heat dissipating material to and from the chamber region.

2. The chip package according to claim 1, wherein the first encapsulation structure comprises an electrically insulating structure.

3. The chip package according to claim 1, wherein the first encapsulation structure comprises glass.

4. The chip package according to claim 1, wherein the first encapsulation structure comprises at least one material from the following group of materials, the group of materials consisting of: plastic, silicon ceramics, glass.

5. The chip package according to claim 1, wherein the first passivation layer comprises at least one material from the following group of materials, the group of materials consisting of: polysilicon, silicon dioxide, silicon nitride, aluminum oxide, diamond like carbon, boron nitride, silicon carbide, silicon oxycarbide.

6. The chip package according to claim 1, wherein the first electrically conductive layer is thermally conductive.

7. The chip package according to claim 1, wherein the first electrically conductive layer comprises at least one at least one material, element or alloy from the following group of materials, the group consisting of: copper, aluminum, silver, tin, tungsten, gold, palladium, zinc, nickel, iron, molybdenum, platinum, ruthenium, rhodium, titanium, chromium.

8. The chip package according to claim 1, wherein the first encapsulation structure comprises at least one recess, wherein the at least one first passivation layer and the at least one first electrically conductive layer are formed in the at least one recess.

9. The chip package according to claim 1, wherein the at least one chip comprises a semiconductor chip.

10. The chip package according to claim 8, wherein the at least one chip is formed at least partially in the at least one recess, wherein the at least one chip contact pad contacts the first electrically conductive layer in the at least one recess.

11. The chip package according to claim 1, wherein the second encapsulation structure comprises at least one material from the following group of materials, the group of materials consisting of: glass, plastic, silicon, ceramics.

12. The chip package according to claim 1, wherein the second encapsulation structure is adhered to the first encapsulation structure.

13. The chip package according to claim 1, wherein the inlet and the outlet each comprises at least one hole formed through the second encapsulation structure.

14. The chip package according to claim 1, wherein the inlet and the outlet control an inflow and outflow of heat dissipating material to and from the chamber region, wherein the heat dissipation material comprises a fluid.

15. The chip package according to claim 1, wherein the inlet and the outlet control an inflow and outflow of heat dissipating material to and from the chamber region, wherein the heat dissipation material comprises at least one material from the following group of material, the group of materials consisting of: air, water, oil, fluorine containing liquids, organic liquids.

16. The chip package according to claim 1, further comprising
   a third encapsulation structure disposed over the first encapsulation structure, wherein the at least one chip is held between the first encapsulation structure and the third encapsulation structure.

17. The chip package according to claim 16, wherein the third encapsulation structure comprises at least one hole formed through the third encapsulation structure, wherein the at least one hole is arranged over at least one further chip contact pad, thereby exposing the at least one further contact pad.

18. The chip package according to claim 16, further comprising
   a second electrically conductive layer formed over the third encapsulation structure and the at least one hole, thereby covering the at least one further contact pad; and
   a second passivation layer formed over the second electrically conductive layer and covering the at least one further contact pad.

19. The chip package according to claim 18, further comprising
   a fourth encapsulation structure formed over the third encapsulation structure and covering the at least one hole, the fourth encapsulation structure and the at least one hole defining a further chamber region over the at least one further chip contact pad.

20. The chip package according to claim 19, further comprising
at least one through-hole formed through the fourth encapsulation structure and the second passivation layer; and
at least one electrical interconnect formed in the at least one through-hole, wherein the at least one electrical interconnect electrically contacts the second electrically conductive layer.

21. The chip package according to claim 20,
wherein the second electrically conductive layer electrically redirects the at least one further chip contact pad to the at least one electrical interconnect.

22. The chip package according to claim 20, further comprising
at least one further through-hole formed through the fourth encapsulation structure, the second passivation layer and the third encapsulation structure; and
at least one further electrical interconnect formed in the at least one further through-hole, wherein the at least one further electrical interconnect electrically contacts the first electrically conductive layer.

23. The chip package according to claim 22,
wherein the second electrically conductive layer electrically redirects the at least one chip contact pad to the at least one further electrical interconnect.

24. The chip package according to claim 19,
wherein the fourth encapsulation structure comprises at least one of a further inlet and further outlet connected to the further chamber region, wherein the at least one of a further inlet and further outlet controls an inflow and outflow of heat dissipating material to and from the further chamber region.

25. The chip package according to claim 16,
wherein the first encapsulation structure supports the at least one chip from the chip sidewalls and at least part of at least one chip bottom side, and wherein the third encapsulation structure is disposed over at least one chip top side.

26. A method for manufacturing a chip package, the method comprising:
forming a first passivation layer over a first encapsulation structure and forming a first electrically conductive layer over the first passivation layer;
arranging at least one chip over the first electrically conductive layer and the first passivation layer wherein at least one chip contact pad contacts the first electrically conductive layer;
forming at least one cavity in the first encapsulation structure, thereby exposing a portion of the first passivation layer covering the at least one chip contact pad;
disposing a second encapsulation structure over the first encapsulation structure and the second encapsulation structure covering the at least one cavity, thereby defining a chamber region over the at least one chip contact pad by the at least one cavity and the second encapsulation structure;
connecting an inlet and outlet of the second encapsulation structure to the chamber region, the inlet and the outlet thereby controlling an inflow and outflow of heat dissipating material to and from the chamber region.

* * * * *